US010460964B2

(12) United States Patent
Sato et al.

(10) Patent No.: US 10,460,964 B2
(45) Date of Patent: Oct. 29, 2019

(54) SUBSTRATE LIQUID PROCESSING APPARATUS AND METHOD, AND COMPUTER-READABLE STORAGE MEDIUM STORED WITH SUBSTRATE LIQUID PROCESSING PROGRAM

(71) Applicant: TOKYO ELECTRON LIMITED, Tokyo (JP)

(72) Inventors: Hideaki Sato, Kumamoto (JP); Hiromi Hara, Kumamoto (JP); Jin Hyun Kim, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 1125 days.

(21) Appl. No.: 14/813,469

(22) Filed: Jul. 30, 2015

(65) Prior Publication Data

US 2016/0042981 A1 Feb. 11, 2016

(30) Foreign Application Priority Data

Aug. 11, 2014 (JP) ................................. 2014-163834

(51) Int. Cl.
*H01L 21/67* (2006.01)

(52) U.S. Cl.
CPC .... *H01L 21/67086* (2013.01); *H01L 21/6704* (2013.01); *H01L 21/6715* (2013.01); *H01L 21/67017* (2013.01); *H01L 21/67023* (2013.01); *H01L 21/67028* (2013.01); *H01L 21/67057* (2013.01); *H01L 21/67075* (2013.01)

(58) Field of Classification Search
None
See application file for complete search history.

(56) References Cited

U.S. PATENT DOCUMENTS

2006/0024213 A1* 2/2006 Arai .................. H01L 21/67057 422/129

FOREIGN PATENT DOCUMENTS

JP 2013-093478 A 5/2013

* cited by examiner

*Primary Examiner* — Sylvia Macarthur
(74) *Attorney, Agent, or Firm* — Abelman, Frayne & Schwab

(57) ABSTRACT

Disclosed a substrate liquid processing apparatus including: a liquid processing section configured to process a substrate with a processing liquid; a processing liquid supply section configured to supply the processing liquid; a diluent supply section configured to supply a diluent for diluting the processing liquid; a controller configured to control the diluent supply section; a concentration detection unit configured to detect a concentration of the processing liquid; and an atmospheric pressure detection unit configured to detect an atmospheric pressure. The controller acquires the concentration of the processing liquid from the concentration detection unit and the atmospheric pressure from the atmospheric pressure detection unit, controls an amount of the diluent supplied from the diluent supply section such that the acquired concentration of the processing liquid becomes a previously set concentration ("set concentration"), and corrects the set concentration according to the acquired atmospheric pressure.

6 Claims, 3 Drawing Sheets

SUBSTRATE LIQUID PROCESSING APPARATUS AND METHOD, AND COMPUTER-READABLE STORAGE MEDIUM STORED WITH SUBSTRATE LIQUID PROCESSING PROGRAM

CROSS-REFERENCE TO RELATED APPLICATIONS

This application is based on and claims priority from Japanese Patent Application No. 2014-163834, filed on Aug. 11, 2014, with the Japan Patent Office, the disclosure of which is incorporated herein in its entirety by reference.

TECHNICAL FIELD

The present disclosure relates to a substrate liquid processing apparatus and method that process a substrate with a processing liquid, and a computer-readable storage medium that stores a substrate liquid processing program.

BACKGROUND

Conventionally, when manufacturing, for example, semiconductor parts or flat panel displays, a processing, such as, for example, an etching, is performed, using a processing liquid such as an etching liquid on, for example, a semiconductor wafer or a liquid crystal substrate, using a substrate liquid processing apparatus.

For example, a substrate liquid processing apparatus, disclosed in Japanese Patent Laid-Open Publication No. 2013-093478, performs a processing such as an etching of a nitride film formed on a surface of a substrate by immersing the substrate in a processing liquid (etching liquid) (e.g., phosphoric acid aqueous solution) stored in a processing bath.

In the substrate liquid processing apparatus, the phosphoric acid aqueous solution, formed by diluting phosphoric acid by pure water to a predetermined concentration, is used as the processing liquid. In addition, in the substrate liquid processing apparatus, when the phosphoric acid aqueous solution is prepared to have the predetermined concentration, the phosphoric acid aqueous solution, formed by diluting phosphoric acid by pure water, is boiled by being heated to a predetermined temperature so that the concentration of the phosphoric acid aqueous solution becomes the concentration of the phosphoric acid aqueous solution at the temperature (boiling point).

SUMMARY

In the present disclosure, a substrate liquid processing apparatus includes: a liquid processing section configured to process a substrate with a processing liquid; a processing liquid supply section configured to supply the processing liquid; a diluent supply section configured to supply a diluent for diluting the processing liquid; a controller configured to control the diluent supply section; a concentration detection unit configured to detect a concentration of the processing liquid; and an atmospheric pressure detection unit configured to detect an atmospheric pressure. The controller acquires the concentration of the processing liquid and the atmospheric pressure from the concentration detection unit and the atmospheric pressure detection unit, controls an amount of the diluent supplied from the diluent supply section such that the acquired concentration of the processing liquid becomes a previously set concentration ("set concentration"), and corrects the set concentration according to the acquired atmospheric pressure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
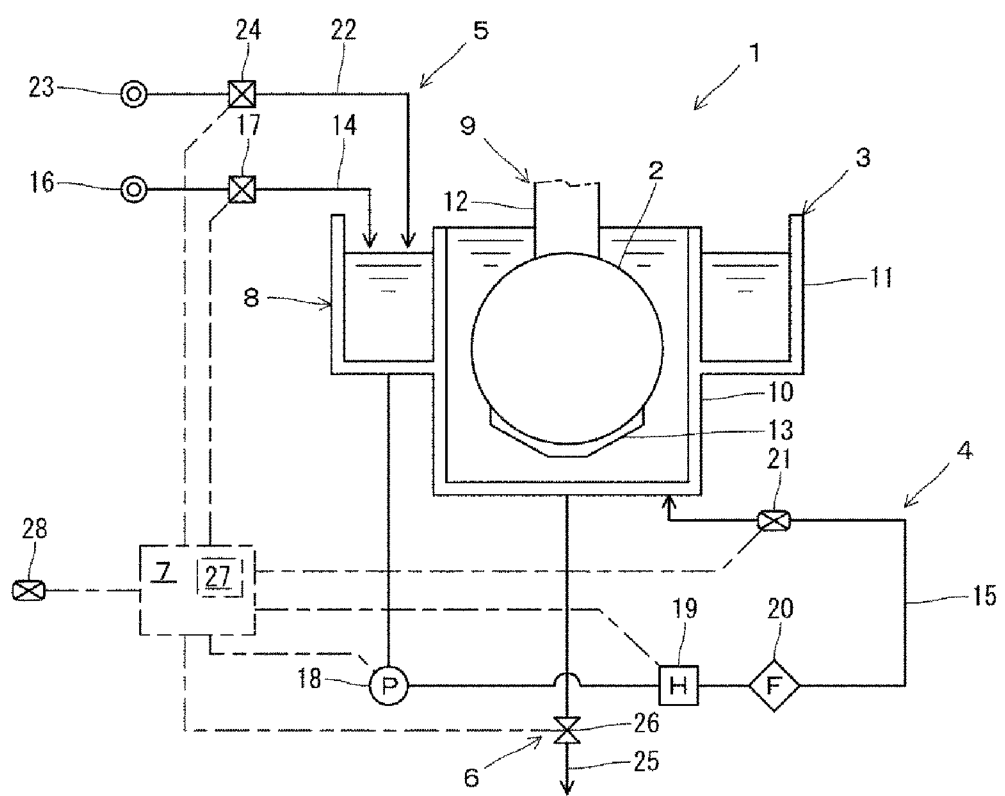
FIG. 1 is an explanatory view illustrating a substrate liquid processing apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The concentration of a processing liquid for processing a substrate is affected by the atmospheric pressure. For example, when the atmospheric pressure declines, the boiling point of the processing liquid declines, and the processing liquid is heated to a temperature higher than the boiling point. Thus, the evaporated amount of the diluent (here, pure water) in the processing liquid increases so that the concentration of the processing liquid increases. Thus, in order to make the concentration of the processing liquid for processing a substrate constant, it is required to supply an increased amount of the diluent to the processing liquid.

However, when the supply amount of diluent increases, the diluent is excessively evaporated so that the substrate may not be properly subjected to the liquid processing.

In the present disclosure, a substrate liquid processing apparatus includes: a liquid processing section configured to process a substrate with a processing liquid; a processing liquid supply section configured to supply the processing liquid; a diluent supply section configured to supply a diluent for diluting the processing liquid; a controller configured to control the diluent supply section; a concentration detection unit configured to detect a concentration of the processing liquid; and an atmospheric pressure detection unit configured to detect an atmospheric pressure. The controller acquires the concentration of the processing liquid and the atmospheric pressure from the concentration detection unit and the atmospheric pressure detection unit, controls an amount of the diluent supplied from the diluent supply section such that the acquired concentration of the processing liquid becomes a previously set concentration ("set concentration"), and corrects the set concentration according to the acquired atmospheric pressure.

The processing liquid supply section is configured to boil the processing liquid to a predetermined temperature so as to supply the processing liquid to the liquid processing section at a concentration at the predetermined temperature. The controller sets the set concentration as the concentration at the predetermined temperature under a previously set atmospheric pressure.

The controller corrects the set concentration to a concentration of the processing liquid which corresponds to the boiling point of the processing liquid under the acquired atmospheric pressure.

A liquid having a boiling point lower than that of the processing liquid is used as the diluent.

In a case of correcting the set concentration, the controller changes a period of time for processing the substrate in the liquid processing section according to the corrected concentration.

In the present disclosure, a substrate liquid processing method includes: detecting a concentration of a processing liquid for processing a substrate and an atmospheric pressure; diluting the processing liquid such that the detected concentration of the processing liquid becomes a previously set concentration ("set concentration") so as to process the substrate; and correcting the set concentration according to the detected atmospheric pressure.

The substrate liquid processing method further includes: boiling the processing liquid to a predetermined temperature so as to supply the processing liquid to the liquid processing section at a concentration at the predetermined temperature; and setting the set concentration as the concentration at the predetermined temperature under a previously set atmospheric pressure.

The substrate liquid processing method further includes: correcting the set concentration to a concentration of the processing liquid which corresponds to the boiling point of the processing liquid under the detected atmospheric pressure.

In addition, a liquid having a boiling point lower than that of the processing liquid is used as the diluent.

In a case of correcting the set concentration, a period of time for processing the substrate in the liquid processing section is changed according to the corrected concentration.

Further, in the present disclosure, there is provided a non-transitory computer-readable recording medium storing an computer-executable program for liquid processing of a substrate using a substrate liquid processing apparatus including a liquid processing section configured to process a substrate with a processing liquid, a processing liquid supply section configured to supply the processing liquid, and a diluent supply section configured to supply a diluent for diluting the processing liquid. When executed, the program causes a computer to acquire the concentration of the processing liquid and the atmospheric pressure from the concentration detection unit and the atmospheric pressure detection unit, to control an amount of the diluent supplied from the diluent supply section such that the acquired concentration of the processing liquid becomes a previously set concentration ("set concentration"), and to correct the set concentration according to the acquired atmospheric pressure.

In the present disclosure, a liquid processing may be properly performed on a substrate even if the atmospheric pressure varies.

Hereinafter, detailed configurations of a substrate liquid processing apparatus, a substrate liquid processing method, and a substrate liquid processing program will be described with reference to the accompanying drawings.

As illustrated in FIG. 1, a substrate liquid processing apparatus 1 includes a liquid processing section 3 configured to process a substrate 2 with a processing liquid, a processing liquid supply section 4 configured to supply the processing liquid to the liquid processing section 3, a diluent supply section 5 configured to supply a diluent for diluting the processing liquid to the liquid processing section 3, a processing liquid discharge section 6 configured to discharge the processing liquid from the liquid processing section 3, and a controller 7 configured to control the liquid processing section 3, the processing liquid supply section 4, the diluent supply section 5, and the processing liquid discharge section 6.

The liquid processing section 3 includes a liquid processing chamber 8 configured to process the substrate 2 with the processing liquid, and a substrate conveyance mechanism 9 configured to convey the substrate 2 to the liquid processing chamber 8.

The liquid processing chamber 8 forms an overflow bath 11 that is top-opened at the outer periphery of the top end of a top-opened processing bath 10.

The substrate conveyance mechanism 9 includes a substrate support 13 attached to the lower end of a liftable arm 12, in which the substrate conveyance mechanism 9 is configured to vertically arrange and support a plurality of substrates 2. The substrate conveyance mechanism 9 is controlled to be moved up and down by the controller 7.

In addition, the liquid processing section 3 stores the processing liquid in the processing bath 10, and immerses the substrate 2 in the processing liquid using the substrate conveyance mechanism 9 so that the substrate 2 is processed by the processing liquid. In addition, the processing liquid overflowing from the processing bath 10 flows into the overflow bath 11. The processing liquid within the overflow bath 11 is in turn supplied to the processing bath 10 as described below.

The processing liquid supply section 4 includes a processing liquid supply path 14 configured to supply the processing liquid to the overflow bath 11 of the liquid processing chamber 8, and a processing liquid circulation path 15 configured to circulate the processing liquid from the overflow bath 11 to the processing bath 10.

The processing liquid supply path 14 includes a processing liquid supply source (here, a phosphoric acid supply source) 16 installed in the base end portion thereof, and a flow rate adjustment unit 17 installed in the midway portion thereof. The flow rate adjustment unit 17 is subjected to a flow rate control by the controller 7.

The processing liquid circulation path 15 includes a pump 18, a heater 19, a filter 20, and a concentration sensor 21 (concentration detection unit) which are installed in the midway portion thereof in this order from the upstream side (overflow bath 11 side). The pump 18 and the heater 19 are subjected to a driving control by the controller 7. In addition, the concentration sensor 21 is connected to the controller 7 so as to detect the concentration of the processing liquid flowing in the processing liquid circulation path 15 and to notify the controller 7 of the concentration.

In addition, the processing liquid supply section 4 supplies the processing liquid from the processing liquid supply source 16 to the overflow bath 11 through the processing liquid supply path 14, and circulates the processing liquid of the overflow bath 11 through the processing liquid circulation path 15 to be supplied to the processing bath 10. At this time, the processing liquid is heated to the predetermined temperature by the heater 19.

The diluent supply section 5 includes a diluent supply path 22 configured to supply the diluent to the overflow bath 11 of the liquid processing chamber 8.

The diluent supply path 22 includes a diluent supply source (here, a pure water supply source) 23 installed in the base end portion thereof, and a flow rate adjustment unit 24 installed in the midway portion thereof. The flow rate adjustment unit 24 is subjected to a flow rate control by the controller 7.

In addition, the diluent supply section 5 supplies the diluent from the diluent supply source 23 to the overflow bath 11 through the diluent supply path 22. The diluent supplied to the overflow bath 11 is supplied to the processing bath 10 from the overflow bath 11 through the processing liquid circulation path 15, together with the processing liquid. At this time, the processing liquid and the diluent are mixed so that the processing liquid is diluted with the diluent.

The processing liquid discharge section 6 includes a processing liquid discharge path 25 configured to discharge the processing liquid to the bottom portion of the processing bath 10 of the liquid processing chamber 8.

The processing liquid discharge path 25 includes an opening/closing valve 26 installed in the midway thereof, and the front end of the processing liquid discharge path 25 is connected to an external drain. The opening/closing valve 26 is subjected to an opening/closing control by the controller 7.

In addition, the processing liquid discharge section 6 discharges the processing liquid stored in the processing bath 10 to the external drain through the processing liquid discharge path 25.

The controller 7 includes a computer, and is configured to control the substrate liquid processing apparatus 1 according to a substrate liquid processing program stored in a computer-readable storage medium 27 so as to perform a liquid processing of the substrate 2. The controller 7 is connected with an atmospheric pressure sensor 28 (atmospheric pressure detection unit) configured to detect the atmospheric pressure. The controller 7 acquires a signal corresponding to the concentration detected by the concentration sensor 21 or the atmospheric pressure detected by the atmospheric pressure sensor 28. The storage medium 27 may be any medium so long as it is capable of storing various programs such as, for example, the substrate liquid processing program, and may also be a storage medium such as, for example, a ROM or a RAM, or a disc type medium such as, for example, a hard disc or a CD-ROM.

The substrate liquid processing apparatus 1 performs the liquid processing of the substrate 2 by sequentially and repeatedly executing a substrate carry-in process for carrying the substrate 2 into the liquid processing chamber 8, a substrate liquid processing process for performing a liquid processing on the substrate 2 in the liquid processing chamber 8, and a substrate carry-out process for carrying the substrate 2 out from the liquid processing chamber 8.

Here, in the substrate carry-in process, the controller 7 causes the arm 12 to be moved up, causes the substrate support 13 to receive the substrate 2, and then causes the arm 12 to be moved down so that the substrate 2 supported on the substrate support 13 is carried into the inside of the processing bath 10.

In the substrate liquid processing process, the controller 7 causes the arm 12 to remain in the stopped state for a predetermined period of time so that the substrate 2 is immersed in the processing liquid stored in the processing bath 10 for the predetermined period of time. As a result, the substrate 2 is processed with the processing liquid.

In the substrate carry-out process, the controller 7 causes the arm 12 to be moved up so that the substrate 2 supported on the substrate support 13 is carried out to the outside of the processing bath 10.

In addition, the substrate liquid processing apparatus 1 stores the processing liquid, which is adjusted to a predetermined concentration in advance, in the processing bath 10 when performing the substrate liquid processing process (before performing the initial substrate liquid processing process, or before performing the substrate carry-in process after the substrate liquid processing process is repeatedly performed).

Figure 2:
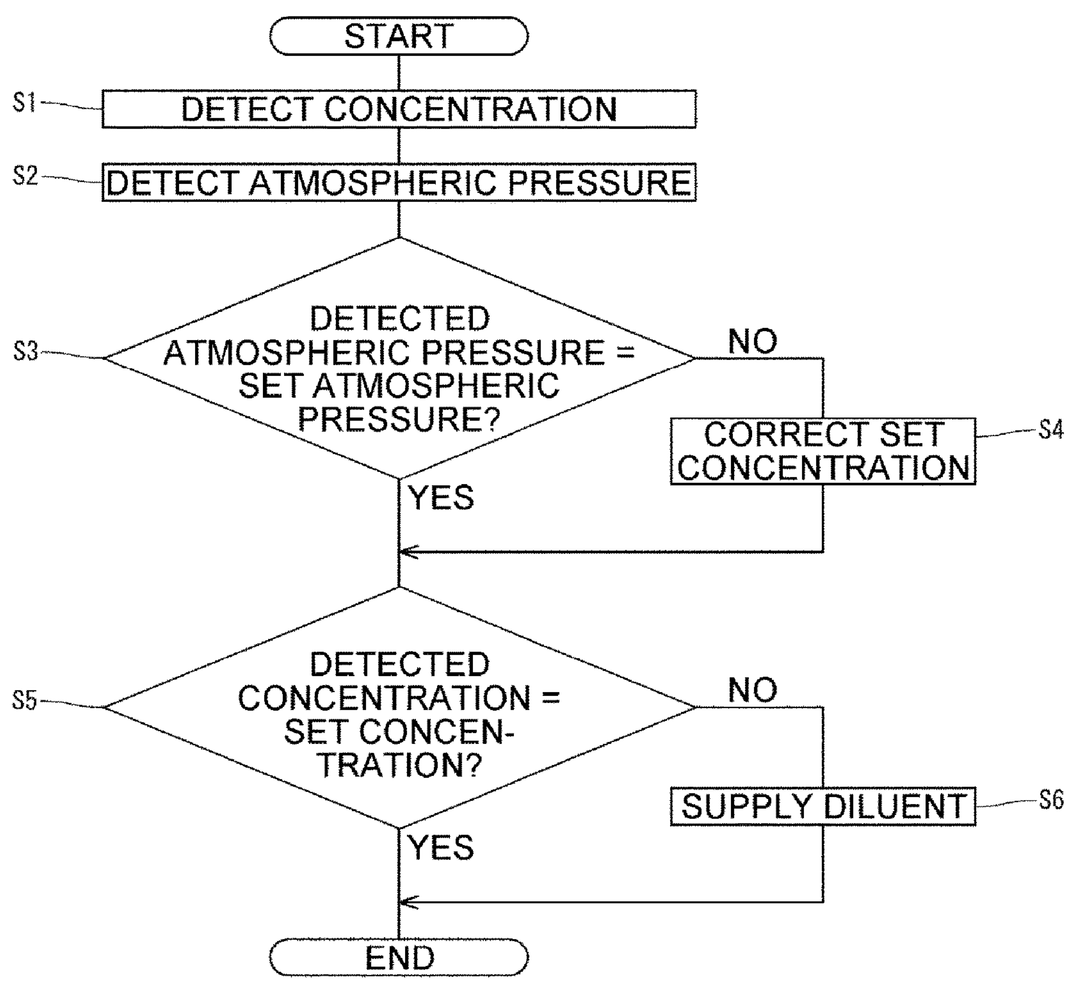
FIG. 2 is a flowchart illustrating a substrate liquid processing program.

The concentration adjustment of the processing liquid is executed according to a substrate liquid processing program as illustrated in FIG. 2. When the concentration adjustment of the processing liquid is executed, an atmospheric pressure (set atmospheric pressure), a temperature of the processing liquid (set temperature), and a concentration of the processing liquid (set concentration) are set in advance to serve as references, respectively. Here, as the atmospheric pressure to serve as the reference, 1013 hPa is set, as the temperature of the processing liquid to serve as the reference, as the temperature of the processing liquid, a temperature T1 (the boiling point of the processing liquid at 1013 hPa) is set, and as the concentration of the processing liquid to serve as the reference, a concentration C1 (the concentration of the processing liquid at 1013 hPa and the temperature T1) is set.

In the substrate liquid processing program, the concentration of the processing liquid is detected by the concentration sensor 21 (concentration detection step S1). In addition, the atmospheric pressure is detected by the atmospheric pressure sensor 28 (atmospheric pressure detection step S2).

Figure 3:
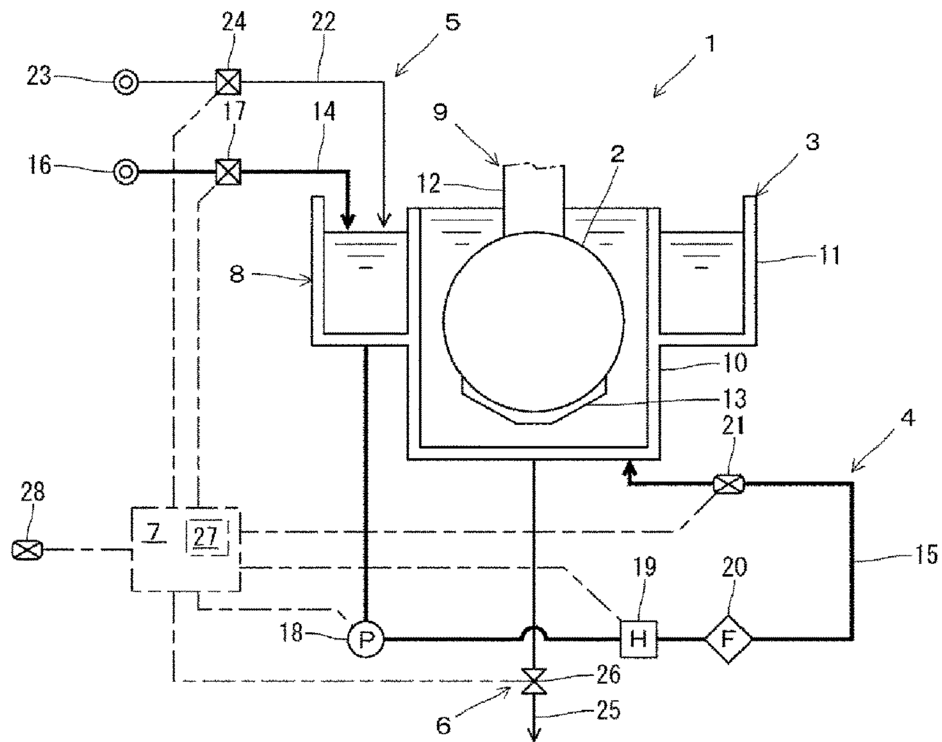
FIG. 3 is an operation explanatory view illustrating the substrate liquid processing apparatus.

At that time, as illustrated in FIG. 3, the substrate liquid processing apparatus 1 supplies the processing liquid to the overflow bath 11 of the liquid processing section 3 from the processing liquid supply path 14 of the processing liquid supply section 4 and circulates the processing liquid between the overflow bath 11 and the processing bath 10 through the processing liquid circulation path 15.

Next, the atmospheric pressure detected in atmospheric pressure detection step S2 (detected atmospheric pressure) and the atmospheric pressure set in advance (set atmospheric pressure) are compared with each other so as to determine whether they are different from each other (atmospheric pressure comparison step S3). Here, without being limited to the case where the detected atmospheric pressure and the set atmospheric pressure are equal to each other, it may be determined that the atmospheric pressure and the set atmospheric pressure are not different from each other even if the detected atmospheric pressure is within a predetermined range that is set in advance with respect to the set atmospheric pressure (e.g., within ±5 hPa).

When it is determined that the detected atmospheric pressure and the set atmospheric pressure are different from each other in atmospheric pressure comparison step S3, the set concentration is corrected (changed) according to the detected atmospheric pressure (set concentration correction step S4).

In the set concentration correction step S4, a correspondence table, in which atmospheric pressures and corrected concentrations are arranged to correspond to each other, may be prepared in advance, and the set concentration may be corrected according to the correspondence table. In addition, the correspondence table may be prepared in such a manner that the concentration is changed successively according to the atmospheric pressures, or the concentration is changed step by step according to the atmospheric pressures. Here, in the case where the detected atmospheric pressure is higher than the set atmospheric pressure by 10 hPa, the boiling point of the processing liquid becomes a temperature T2 that is higher than the temperature T1 and the concentration of the processing liquid at that time becomes a concentration C2 that is lower than the concentration C1. Thus, the set concentration is corrected to the concentration C2. Meanwhile, in the case where the detected atmospheric pressure is lower than the set atmospheric pressure by 10 hPa, the boiling point of the processing liquid becomes a temperature T3 that is lower than the temperature T1 and the concentration of the processing liquid at that time becomes a concentration C3 which is higher than the concentration C1. Thus, the set concentration is corrected to the concentration C3. When the set concentration is corrected, the processing time may be changed to that corresponding to the set concentration after the correction and the substrate 2 in the substrate liquid processing process may be processed with the processing liquid having the set concentration after the correction.

Next, the concentration of the processing liquid detected in concentration detection step S1 (detected concentration) and the previously set processing liquid (set concentration) are compared with each other so as to determine whether they are different from each other (concentration comparison step S5). Here, without being limited to the case where the detected concentration and the set concentration are equal to each other, it may be determined that the detected concentration and the set concentration are not different from each other even if the detected concentration is within a predetermined range with respect to the set concentration (e.g., within ±0.02 wt %).

When it is determined that the detected concentration and the set concentration are different from each other in concentration comparison step S5, the diluent is supplied from the diluent supply section 5 by an amount calculated from the difference between the detected concentration and the set concentration (diluent supply step S6). In addition, a predetermined amount of diluent may be continuously supplied from the diluent supply section 5 until it is determined that the detected concentration and the set concentration are not different from each other.

Figure 4:
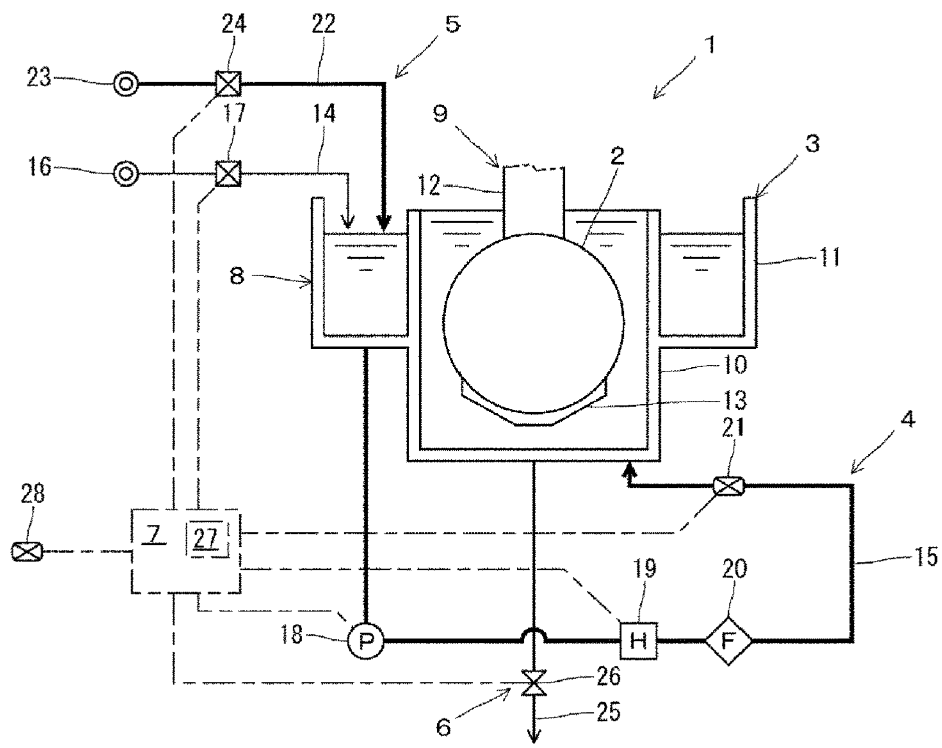
FIG. 4 is an operation explanatory view illustrating the substrate liquid processing apparatus.

At that time, as illustrated in FIG. 4, the substrate liquid processing apparatus 1 supplies the diluent from the diluent supply path 22 of the diluent supply section 5 to the overflow bath 11 of the liquid processing section 3, and circulates the diluent together with the processing liquid between the overflow bath 11 and the processing bath 10 through the processing liquid circulation path 15 so that the processing liquid is diluted with the diluent.

As a result, in the substrate liquid processing apparatus 1, the concentration of the processing liquid for processing the substrate 2 may be adjusted to a predetermined concentration.

In this way, the substrate liquid processing program corrects the set concentration according to the detected atmospheric pressure in set concentration correction step S4. The set concentration correction may be performed in the following manner: a set concentration after correction which corresponds to a detected atmospheric pressure may be determined in advance and the previously set concentration may be corrected to the set concentration after correction, or to a concentration corresponding to the boiling point of the processing liquid at the detected atmosphere (e.g., a saturation concentration). In addition, while the set concentration may be corrected either when the detected atmospheric pressure increases or decreases with respect to the set atmospheric pressure, the set concentration may also be corrected only when the detected atmospheric pressure decrease with respect to the set atmospheric pressure. As a result, in particular, when a liquid having a boiling point lower than that of the processing liquid is used as the diluent, excessive boiling of the diluent may be avoided.

As described above, the substrate liquid processing method corrects a set concentration of a processing liquid according to a detected atmospheric pressure and dilutes the set concentration of the processing liquid by a diluent, based on a substrate liquid processing program executed in the substrate liquid processing apparatus 1. Thus, even if a variation occurs in the atmospheric pressure, the liquid processing may be properly performed on a substrate 2 without excessively boiling the processing liquid.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate liquid processing apparatus comprising:

a liquid processing chamber of which a top is opened, and configured to process a substrate with a processing liquid;

a processing liquid supply source connected to the liquid processing chamber through a processing liquid supply path provided with a first flow rate controller, and configured to supply the processing liquid to the liquid processing chamber through the processing liquid supply path;

a diluent supply source connected to the liquid processing chamber through a diluent supply path provided with a second flow rate controller, and configured to supply a diluent for diluting the processing liquid to the liquid processing chamber through the diluent supply path;

a controller configured to control the first flow rate controller and the second flow rate controller;

a concentration sensor connected to the controller, and provided on a circulation path of which both ends are connected with the liquid processing chamber, the concentration sensor being configured to detect a concentration of the processing liquid;

an atmospheric pressure sensor connected to the controller and configured to detect an atmospheric pressure, wherein the controller is programmed to:

identify a set atmospheric pressure and a set concentration of the processing liquid, respectively;

detect the concentration of the processing liquid and the atmospheric pressure using the concentration sensor and the atmospheric pressure sensor, respectively;

when the detected atmospheric pressure is not equal to the set atmospheric pressure, correct the set concentration of the processing liquid according to the detected atmospheric pressure; and when the detected concentration of the processing liquid is not equal to the set concentration of the processing liquid, control the second flow rate controller of the diluent supply path such that an amount of the diluent supplied from the diluent supply source to the liquid processing chamber is adjusted, thereby allowing the detected concentration of the processing liquid to become the set concentration of the processing liquid.

2. The substrate liquid processing apparatus of claim 1, wherein the circulation path is provided with a heater, the heater of the circulation path is configured to boil the processing liquid to a predetermined temperature so as to supply the processing liquid to the liquid processing chamber at a concentration at the predetermined temperature, and the controller is programmed to identify the concentration at the predetermined temperature of the processing liquid under the set atmospheric pressure as the set concentration.

3. The substrate liquid processing apparatus of claim 2, wherein the controller is programmed to correct the set concentration to a concentration of the processing liquid which corresponds to the boiling point of the processing liquid under the detected atmospheric pressure.

4. The substrate liquid processing apparatus of claim 2, wherein a liquid having a boiling point lower than that of the processing liquid is used as the diluent.

5. The substrate liquid processing apparatus of claim 1, wherein, when the set concentration of the processing liquid is corrected, the controller is programed to change a period of time for processing the substrate in the liquid processing chamber according to the corrected set concentration.

6. The substrate liquid processing apparatus of claim 1, wherein the controller is configured to control the second flow rate controller of the diluent supply path such that the amount of the diluent calculated using a difference between the detected concentration and the set concentration of the processing liquid is supplied from the diluent supply source to the liquid processing chamber.

* * * * *